United States Patent [19]

Dimon

[11] 3,990,016

[45] Nov. 2, 1976

[54] ASYNCHRONOUS DEMODULATOR

[76] Inventor: Donald Dimon, Box 519, Arlington Heights, Ill. 60006

[22] Filed: Apr. 23, 1975

[21] Appl. No.: 570,634

[52] U.S. Cl. ............................... 329/135; 329/124; 331/12
[51] Int. Cl.² .......................................... H03D 5/00
[58] Field of Search ........... 329/124, 112, 135, 146; 331/12

[56] References Cited
UNITED STATES PATENTS

| | | | |
|---|---|---|---|
| 3,568,067 | 3/1971 | Williford | 329/124 |
| 3,665,304 | 5/1972 | Maybach | 329/124 |
| 3,748,590 | 7/1973 | Gray | 331/12 |

*Primary Examiner*—John Kominski
*Attorney, Agent, or Firm*—Hill, Gross, Simpson, Van Santen, Steadman, Chiara & Simpson

[57] ABSTRACT

Phase detectors in quadrature whose outputs are simultaneously coupled to: high pass networks and cross coupled multipliers with the output summed to produce a signal proportional to the frequency difference of the signals applied to the aforesaid phase detectors; and, multipliers arranged to square the output of each phase detector whose outputs are summed to produce a signal proportional to the square of the product of the amplitudes of the signals applied to the aforesaid phase detectors.

3 Claims, 3 Drawing Figures

ASYNCHRONOUS DEMODULATOR

BACKGROUND OF THE INVENTION

This invention relates to frequency and amplitude demodulation systems which provide either frequency demodulation or amplitude demodulation or both with respect to an applied reference signal.

Prior art frequency demodulation systems require that the reference frequency be provided by means of a tuned structure as in phase, slope and ratio detector circuits; or, by means of a voltage controlled reference oscillator as in a phase locked loop. This invention provides detection about an applied reference signal frequency, eliminating the need for a tuned structure, and does not require phase, frequency or other synchronous locking to obtain frequency demodulation. This invention provides a novel and useful feature of producing an instantaneous replica of the frequency difference of two applied signal frequencies, and that the output may be linear.

SUMMARY OF THE INVENTION

The present invention provides demodulation of a frequency modulated carrier by application of reference carrier. The novel detection process is accomplished by a pair of phase detectors arranged in quadrature, whose outputs are applied to a pair of frequency selective networks and the output of one phase detector is multiplied by the output of the frequency selective network driven by the other phase detector, and the output of said other phase detector is multiplied by the output of the frequency selective network driven by the first phase detector. The outputs of the multiplication networks or apparatus is summed to produce the desired output which is in accordance with the frequency excursions of one carrier with respect to the other applied carrier signal.

Also, this invention provides amplitude demodulation of an amplitude modulated carrier with respect to a reference carrier. Demodulation takes place by a pair of phase detectors arranged in phase quadrature whose outputs are each squared and summed to produce an output free of the beat note frequency between said applied signal carriers and in accordance with the product of the applied signal amplitudes.

This invention provides commonality of elements for simultaneous demodulation of A.M. and F.M. content of a given carrier, or of selection of either type of modulation. This invention provides that frequency demodulation may be free of amplitude noise or other amplitude disturbances without the employment of limiting prior to detection.

One object of this invention is to provide frequency demodulation or to provide a frequency discriminator.

Another object of this invention is to provide a frequency comparison of two applied signals.

Another object of this invention is to eliminate bulky tuned circuits in frequency demodulation systems.

Another object of this invention is to provide frequency, amplitude or simultaneous demodulation of one or two applied carriers.

Another object of this invention is to provide frequency, amplitude or simultaneous detection of one or two applied signals without the requirement for synchronous locking of the two applied signal carriers.

Another object of this invention is to provide a phase locked loop in which frequency or amplitude or both demodulations may occur separately or simultaneously prior to locking and after locking, without the reproduction of a beat note in either or both demodulation outputs, and with full and faithfull reproduction of either F.M. or A.M. or both modulations at all times.

Another object of this invention is to provide an asynchronous demodulation system with the advantages known in the prior art to phase locked and aynchronous demodulation systems, without the drawbacks afforded by such systems prior to locking and without the requirement of maintaining lock at all times.

Another object of this invention is to provide a miniaturized demodulation system for F.M., A.M. or both or simultaneous F.M. and A.M. detection.

Another object of this invention is to provide a direct conversion system by reducing an incoming modulated carrier to baseband without the need of Intermediate Frequency amplifiers.

Prior art amplitude demodulation systems require that high level signals, band pass filtered be applied to an envelope detector or that complete phase locking be achieved as in quadrature phase locked loop amplitude demodulation systems to eliminate the objectionable beat note which occurs prior to synchronous locking of applied signals. This invention achieves faithfull amplitude demodulation without bandpass filtering prior to detection and without any beat note production. This invention achieves demodulation of an amplitude modulated signal about an applied reference signal frequency.

This invention provides common elements in both amplitude and frequency demodulation processes and thus, either type of detection or both types may be accomplished simultaneously or separately with efficiency and economy.

This invention achieves its demodulation processes with circuital elements that may be reduced to integrated circuits and thus may be miniaturized.

Prior art frequency demodulation systems use limiting to increase F.M. signal to noise improvement at the loss of all amplitude modulation content. This invention achieves F.M. signal to noise improvement without limiting and without loss of amplitude modulation content which may be simultaneously recovered.

DESCRIPTION OF THE PREFERRED F.M. EMBODIMENT

Figure 1:
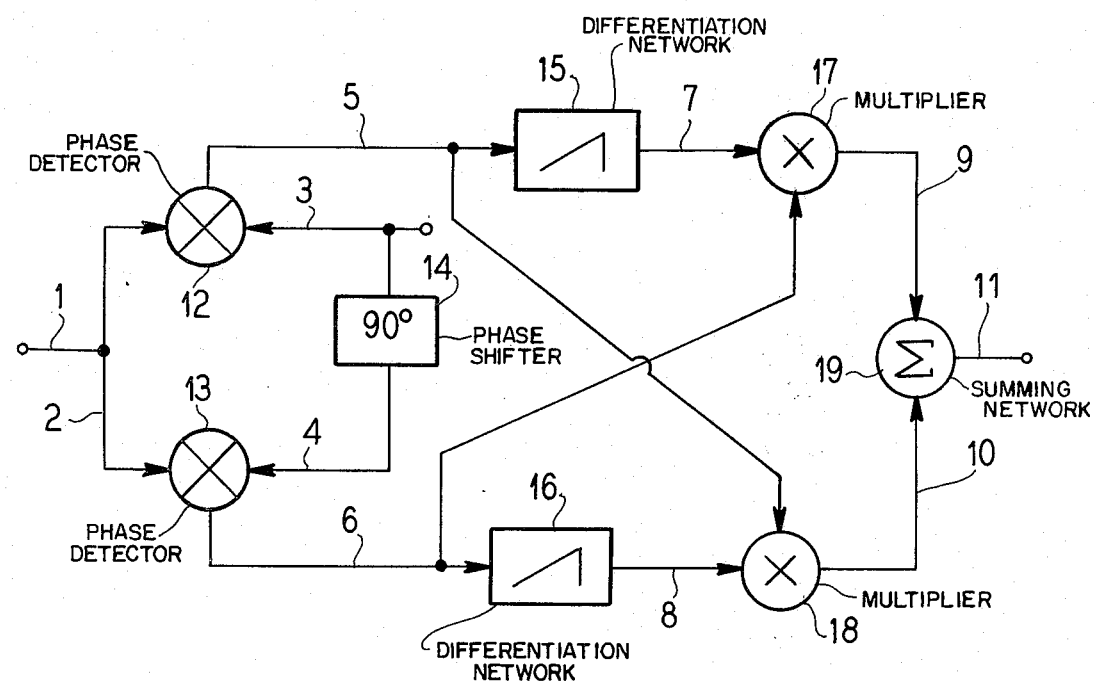
FIG. 1 is a schematic diagram of a preferred frequency modulation embodiment hereof.

In FIG. 1, a schematic diagram is shown of the present invention for use with frequency modulated signals, or to provide frequency discrimination between two applied signals. An incoming signal 1 is applied to a pair of phase detectors 12 and 13. Said phase detectors 12 and 13 are driven by reference signals 3 and 4 which are 90° out of phase by virtue of the phase shift network 14. The output 5 of phase detector 12 is applied to a differentiation network 15 and to an input of multiplier 18. Simultaneously, the output 6 of phase detector 13 is applied to a differentiation network 16 and to an input of multiplier 17. The outputs 9 and 10 of multipliers 17 and 18 are applied to a summing network 19 to produce at the output 11 of said summing network 19 a signal which is linearly proportional to the frequency difference of applied signals 1 and 3. For good linearity, and economy of manufacture, corresponding circuital elements are made alike, such as the phase detectors 12 and 13, the networks 15 and 16 and the multipliers 17 and 18. In particular, the differentiation networks 15 and 16 affect good linearity.

It will be helpful here to review the mathematics included in the preferred F.M. embodiment of FIG. 1 to illustrate the means by which frequency demodulation is achieved. In FIG. 1, let the incoming signal be represented by $A \cos \int v \, dt$, where A is the carrier amplitude in volts, $v$ is the carrier frequency in radians per second, and $t$ is the time in seconds. Let the reference signal 3 be represented by $B \cos \int w \, dt$, B is the amplitude in volts, $w$ is the carrier frequency in radians per second, and $t$ is the time in seconds. The phase detector 12 will produce an output 5 which will contain the difference frequency, the summed frequency being filtered out which is seen to be $\frac{1}{2}AB \cos \int (v-w) \, dt$. The phase shifted signal 4 will be $-B \sin \int w \, dt$. The output of phase detector 13 will be the difference frequency signal 6 seen to be $\frac{1}{2}AB \sin \int (v-w) \, dt$, the summed frequency being filtered out. The output of differentiation network 15 will be $(v-w)AB \sin \int (v-w) \, dt$. The output of differentiation network 16 will be $(v-w)AB \cos \int (v-w) \, dt$. Multiplying signals 6 and 7 together in multiplier 17 will produce $\frac{1}{2}A^2B^2(v-w) \cos^2 \int (v-w) \, dt$; and, multiplying signals 5 and 8 together in multiplier 18, we have at 10, $\frac{1}{2}A^2B^2(v-w) \sin^2 \int (v-w) \, dt$. Summation of signals 9 and 10 in the network 19, will produce 11 which is $\frac{1}{4}A^2B^2(v-w)$, which is seen to contain a factor $(v-w)$ which is directly proportional to the frequency difference of the applied carriers 1 and 3. The amplitude factors A and B must be regulated or otherwise limited or controlled to remove other modulations and noise prior to frequency detection, or, as well known in the electrical arts, amplitude control may be imposed at 5 and 6, or at other portions with care to prevent harmonic distortion and nonlinearity of output at 11.

The phase quadrature detection process at 12, 13 and network 14, may of course be varied in accordance with well know variations, for example by breaking the connection at input of 13 and having signal inputs 1 and 2 in phase quadrature and signals 3 and 4 be at 0° or 180° phase relationship. Or, for example any number of phase relations between inputs 1, 2, 3 and 4, all providing that outputs 5 and 6 are at 90°. Also, of course, a single phase detector may be employed with a phase shift network to provide signals 5 and 6 in phase quadrature. However, this method suffers from difficulties in maintaining 90° phase shift over a wide range of beat note frequencies and as such does not perform as well as the means employed in the illustrated embodiment of FIG. 1.

It is clear to anyone skilled in the communications arts, that amplifiers and filter networks or both may be inserted between phase detectors 12 and 13 and networks 15, 16, 17 and 18. Thereby, the signal paths 5 and 6 may be used to enhance the sensitivity of the system and to provide protection from other signals which are not to be demodulated and whose signals are not to disturb the output 11. Other variations will of course be obvious and the embodiment shown in FIG. 1 is illustrative only and not limiting upon the broad invention.

Figure 2:
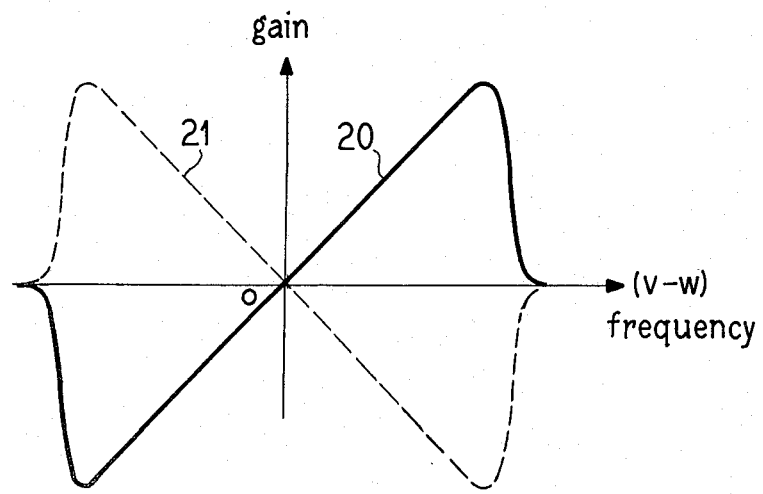
FIG. 2 is a graph illustrating the frequency demodulation performance of the embodiment in FIG. 1.

FIG. 2 illustrates the gain versus frequency differences of applied signals obtained at output 11 of the FIG. 1 embodiment. The curve 20 illustrates the linearity achieved. In the event that network 14 in FIG. 1 is to have $-90°$ phase shift instead of 90°, that the polarity of output 11 will be reversed as shown in the dashed line 21 in FIG. 2. It is clear that either $v$ or $w$ or both may be time variant quantities, and that the output at 11 will faithfully respond to such frequency variations.

In FIG. 1, it is clear that signal 3 or 1 may be supplied by a voltage controlled oscillator driven from an amplified and filtered signal 5 or 6, as well known in the arts of phase locked loops, and that the output at 11 will contain true frequency demodulation before and after attaining lock. In such applications of the present invention, the signal 11 may also be added into the voltage controlled oscillator input to provide damping and to enhance loop stability.

It is also clear, that the signal output 11 may be used to drive a voltage controlled oscillator directly which output may be introduced as the signal at 1 or 3 to achieve a frequency locked loop. Other uses and variations are also apparent, as that the output at 11 may be used to drive a variable frequency oscillator located ahead of the signal path 1 or 2 and mixed with an input signal to also achieve automatic frequency control. Thus, the present invention achieves all the uses of prior art frequency discriminators and phase locked loop demodulators with many important new and useful features.

DESCRIPTION OF THE PREFERRED A.M., F.M. EMBODIMENT

Figure 3:
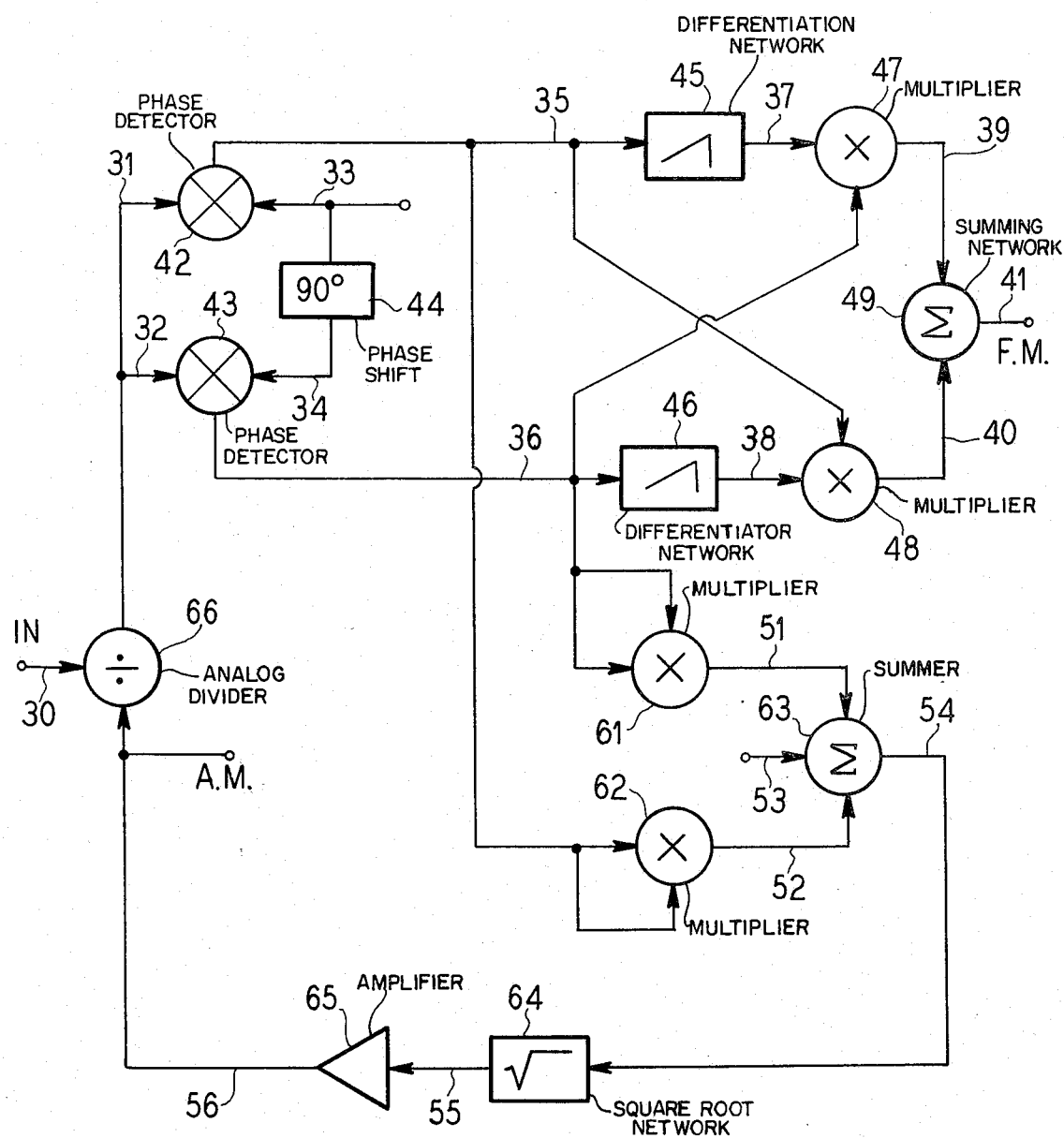
FIG. 3 is a schematic diagram of a preferred amplitude and frequency modulation embodiment hereof in accordance with the present invention.

FIG. 3 illustrates a schematic diagram of a preferred embodiment of the present invention to accomplish frequency demodulation, amplitude demodulation or both. For clarity, the FIG. 1 embodiment is seen incorporated in FIG. 3 as elements 31 through 49 which correspond to elements 1 through 19 respectively of FIG. 1. In FIG. 3, beat note signals 35 and 36 in quadrature are applied to multipliers 61 and 62 arranged to square signals 35 and 36. The multipliers 61 and 62 produce signals 51 and 52 which are summed to remove the beat note at 63, compared to a reference amplitude 53 and the summed signals at 54 are introduced into a square root network 64, whose output 55 is amplified at 65 to drive an analog divider 66. Said analog divider, or gain controlled amplifier 66 is controlled at 56. A signal to be amplitude demodulated is introduced at 30, amplitude demodulated by virtue of the feedback demodulator loop and thence introduced into the phase detectors 42 and 43. The demodulated amplitude data is obtainable at 56. The system will produce frequency demodulation data at 41, and the amplitude demodulation loop will serve to remove amplitude noise or data from disturbing the output at 41.

It will be helpful here to review the mathematics included in the preferred A.M., F.M. embodiment shown in FIG. 3. Let the incoming signal 30 be represented by $x \cos \int v \, dt$, where $x$ is the amplitude in volts, which may include modulation variations with time. Let the signal obtained at 56 be represented by $z$ volts so that the output of divider 66 will be $(x/z) \cos \int v \, dt$. Signals 33 and 34 are denoted by $B \cos \int w \, dt$ and $-B$ Sin $\int wdt$ respectively. The signals 35 and 36 will be seen to be $\frac{1}{2}(x/z)B \cos \int (v-w)dt$ and $\frac{1}{2}(x/z)B \sin \int (v-w)dt$ respectively. Squaring and summing provides that the sum of signals 51 and 52 will be seen to be $\frac{1}{4}(x/z)^2B^2$, which is free of the beat note and frequency modulation signals. A negative reference of 1 volt is applied at 53 into summing network 63, the square root is taken at 64 and amplified by amplifier 65, having a gain of $k$ to produce the signal $z$. Hence, it is seen that we have a relationship in $x$ and $z$ as follows:

$$k(\sqrt{-1 + \frac{1}{4}(x/z)^2B^2}) = z$$

As $k$ may be made quite large, we see that, $z = \frac{1}{2}xB$. Hence, the recovered signal 56 is a signal containing the amplitude modulation factor of the incoming signal 30. It is also seen that the signal applied to the phase detectors at 31 will have an amplitude of $x/z$ or $\frac{1}{2}B$ volts, and that the amplitude variations of all applied signals will be cancelled according to the amplitude demodulation tracking loop to provide quadrature signals 35 and 36 which are free of amplitude changes. The output at 41 will be in accordance only with the frequency difference of the applied carriers; and, the output at 56 will be only in accordance with the amplitude modulation content of the incoming signals at 30 and 33.

It is clear to anyone skilled in the electrical and communications arts that many variations upon the preferred embodiment may be accomplished without changing the spirit and scope of the broad invention, and that the illustrated embodiment is exemplary only. For example, the square root network may be omitted, since the high gain of amplifier 65 will correct for the slight errors encountered, however, the square root network is preferably if the amplifier gain is low. In the event that a limiter is to be used for frequency demodulation, the divider 66 may be inserted in signal path 33, 34, 35 or 36 or elsewheres such as 37, 38, 39 or 40 to help in reduction of beat note interference. In the event that frequency modulation performance does not require feedback amplitude regulation as shown in FIG. 3, the divider 66 and amplifier 65 may be removed and amplitude demodulation data taken directly at signal path 55. It is clear that either A.M. or F.M. demodulation may be accomplished separately or simultaneously with appropriate portions of the embodiment shown utilized as described herein.

I claim:

1. A system for simultaneously demodulating an incoming carrier signal to remove amplitude and frequency modulated signals therefrom comprising:
   a frequency demodulator comprising a pair of phase detectors receiving said incoming carrier signal, a reference signal source connected to one of said pair of phase detectors, a ninety degree phase shifter connected between said other phase detector and said reference signal source,
   a frequency discriminator connected to the outputs of said first and second phase detectors and producing the frequency modulated signal,
   a pair of multipliers respectively receiving the outputs of said pair of phase detectors,
   a reference amplitude signal source,
   a summing device receiving the outputs of said pair of multipliers and said reference amplitude signal source output, said amplitude modulated signal obtained from the output of said summing device, including an analog divider connected between said input to said pair of phase detectors and said summing device and also receiving said incoming carrier signal.

2. A system according to claim 1 including a square root device between said summing device and said analog divider.

3. A system according to claim 2 including an amplifier between said square root device and said analog divider.

* * * * *